United States Patent
Roberts et al.

(10) Patent No.: US 10,300,398 B2
(45) Date of Patent: May 28, 2019

(54) PROTECTIVE ENCLOSURE FOR MODEL VEHICLE

(71) Applicant: TRAXXAS LP, McKinney, TX (US)

(72) Inventors: Timothy E. Roberts, Erie, CO (US); Jon Kenneth Lampert, Allen, TX (US); Otto Karl Allmendinger, Rowlett, TX (US)

(73) Assignee: TRAXXAS L.P., McKinney, TX (US)

( * ) Notice: Subject to any disclaimer, the term of this patent is extended or adjusted under 35 U.S.C. 154(b) by 0 days.

(21) Appl. No.: 15/841,038

(22) Filed: Dec. 13, 2017

(65) Prior Publication Data

US 2018/0104606 A1 Apr. 19, 2018

Related U.S. Application Data

(63) Continuation of application No. 14/642,472, filed on Mar. 9, 2015, now Pat. No. 9,844,736, which is a
(Continued)

(51) Int. Cl.
*A63H 17/26* (2006.01)
*H05K 5/00* (2006.01)
(Continued)

(52) U.S. Cl.
CPC ........... *A63H 17/26* (2013.01); *A63H 17/262* (2013.01); *A63H 29/24* (2013.01); *A63H 30/00* (2013.01);
(Continued)

(58) Field of Classification Search
CPC ........ A63H 17/26; A63H 29/24; H05K 5/069; H01R 4/2429
(Continued)

(56) References Cited

U.S. PATENT DOCUMENTS

| | | | | |
|---|---|---|---|---|
| 3,187,462 A | * | 6/1965 | Licitis | A63H 17/00 200/501 |
| 3,354,454 A | * | 11/1967 | Rueger | F21S 8/00 174/559 |

(Continued)

FOREIGN PATENT DOCUMENTS

| | | |
|---|---|---|
| DE | 102009005716 A1 | 7/2010 |
| DE | 102012213200 A1 | 2/2013 |

(Continued)

OTHER PUBLICATIONS

Traxxas LP; "VillainEx" photographs; May 2003.
(Continued)

*Primary Examiner* — Alexander R Niconovich
(74) *Attorney, Agent, or Firm* — Daryl R. Wright; Greg Carr

(57) ABSTRACT

The present invention provides for a protective enclosure comprising a base comprising a first continuous mating surface and at least one conveyance aperture, a cover comprising a second continuous mating surface, wherein the second continuous mating surface is configured to form a seal with the first continuous mating surface, and a clamp, wherein at least a portion of the clamp is coupleable to the base, wherein a mouth of the clamp is configured to be offset from the aperture when the clamp is coupled to the base, wherein the clamp comprises a first sealing layer, and wherein the clamp is configured to seal the aperture against contaminants. The protective enclosure may be configured for use in a remotely controllable model vehicle to protect a control module.

20 Claims, 7 Drawing Sheets

Related U.S. Application Data continuation of application No. 13/649,777, filed on Oct. 11, 2012, now Pat. No. 8,976,511, which is a continuation of application No. 11/872,872, filed on Oct. 16, 2007, now Pat. No. 8,315,040.

(51) Int. Cl.
*H01R 4/24* (2018.01)
*H05K 5/06* (2006.01)
*A63H 30/00* (2006.01)
*B65D 25/00* (2006.01)
*A63H 29/24* (2006.01)
*H01R 4/2429* (2018.01)

(52) U.S. Cl.
CPC ........... *B65D 25/00* (2013.01); *H01R 4/2429* (2013.01); *H05K 5/069* (2013.01); *H05K 5/00* (2013.01)

(58) Field of Classification Search
USPC ................. 446/78, 269, 431, 439, 470, 484; 361/622, 679.01, 679.4, 679.58, 725, 728
See application file for complete search history.

(56) References Cited

U.S. PATENT DOCUMENTS

| | | | |
|---|---|---|---|
| 3,879,255 A * | 4/1975 | Mason | E04F 21/00 156/527 |
| 3,994,555 A * | 11/1976 | Konno | H01R 13/516 439/472 |
| 4,225,655 A * | 9/1980 | Pesce | H01M 2/1072 206/811 |
| 4,394,692 A * | 7/1983 | Randmae | H04N 5/2252 348/143 |
| 4,533,201 A * | 8/1985 | Wasserlein, Jr. | H01R 4/2429 439/391 |
| 4,698,459 A * | 10/1987 | Drake | H01R 11/284 174/138 F |
| 4,850,884 A * | 7/1989 | Sawai | B60R 16/0239 439/76.2 |
| 5,009,612 A * | 4/1991 | Rishworth | H01R 12/616 439/403 |
| 5,088,010 A * | 2/1992 | Wimmer | G08G 1/095 174/45 R |
| 5,317,462 A * | 5/1994 | Kakizaki | G11B 33/1466 174/564 |
| 5,394,208 A * | 2/1995 | Campbell | G03B 29/00 348/E5.026 |
| 5,588,856 A * | 12/1996 | Collins | H01R 13/5208 439/204 |
| 5,833,486 A * | 11/1998 | Shinozaki | H01R 13/73 439/404 |
| 5,911,594 A * | 6/1999 | Baker, III | H01R 13/6463 439/404 |
| 5,971,792 A * | 10/1999 | Lin | H01R 43/01 439/404 |
| 6,315,596 B1 * | 11/2001 | Chen | H01R 4/2433 439/417 |
| 6,328,592 B1 * | 12/2001 | Burke | H01R 4/2429 439/404 |
| 6,362,421 B1 * | 3/2002 | Layton, Jr. | H02G 3/081 174/50 |
| 6,364,736 B1 * | 4/2002 | Lee | A63H 17/12 446/431 |
| 6,572,395 B1 * | 6/2003 | Burlew | H01R 13/5219 439/198 |
| 6,575,809 B2 * | 6/2003 | Ogawa | A63H 18/00 446/429 |
| 6,602,089 B2 * | 8/2003 | Abe | H01R 12/675 29/854 |
| 7,377,295 B2 * | 5/2008 | Byers | A63H 17/262 141/350 |
| 7,402,073 B2 * | 7/2008 | Yotsutani | H01R 13/6585 439/394 |
| 7,497,757 B2 * | 3/2009 | Hamasaki | A63H 17/05 446/434 |
| 7,762,415 B2 * | 7/2010 | Matsui | H05K 5/0069 174/58 |
| 7,762,731 B2 * | 7/2010 | Arbuckle | G03B 17/08 277/628 |
| 7,835,634 B2 * | 11/2010 | Berend | H04N 5/2252 396/25 |
| 8,026,443 B1 * | 9/2011 | Czarnecki | H02G 3/085 174/50 |
| 8,315,040 B2 | 11/2012 | Roberts et al. | |
| 8,488,314 B1 * | 7/2013 | Ashcraft | G06F 1/1679 312/223.1 |
| 8,625,290 B2 * | 1/2014 | Wee | H05K 5/069 361/752 |
| 8,976,511 B1 | 3/2015 | Roberts et al. | |
| 8,982,541 B1 | 3/2015 | Roberts et al. | |
| 2002/0079653 A1 * | 6/2002 | Noguchi | H05K 5/061 277/628 |
| 2009/0302034 A1 * | 12/2009 | Makela | H02G 3/0658 220/3.8 |
| 2011/0057778 A1 | 3/2011 | DeWitt et al. | |
| 2011/0059760 A1 | 3/2011 | DeWitt et al. | |
| 2011/0063090 A1 | 3/2011 | DeWitt et al. | |
| 2015/0131241 A1 * | 5/2015 | Sprowl | A63H 29/22 361/752 |
| 2015/0270693 A1 * | 9/2015 | Thornton | H01R 13/52 174/50 |

FOREIGN PATENT DOCUMENTS

GB 2115614 A 9/1983
JP H0298685 U 4/1990

OTHER PUBLICATIONS

Traxxas LP; "VillainEX Details" web brochure; May 2003.
Traxxas LP; "VillainEX Details" photograph; May 2003.
Traxxas LP; "VillainEX Model 1502 Owners Manual"; May 2003.
Traxxas LP; "VillainEX Model 1502 Exploded Views"; May 2003.
International Search Report by the ISA/EP, dated Nov. 25, 2014, re PCT Application No. PCT/US2014/044959.
Final Office Action, dated Nov. 28, 2016, by the USPTO, re U.S. Appl. No. 14/320,486.

* cited by examiner

PROTECTIVE ENCLOSURE FOR MODEL VEHICLE

CROSS-REFERENCE TO RELATED APPLICATIONS

This application is a continuation of, and claims the benefit of the filing date of, co-pending U.S. patent application Ser. No. 14/642,472, entitled PROTECTIVE ENCLOSURE FOR MODEL VEHICLE, filed Mar. 9, 2015, which is a continuation of U.S. patent application Ser. No. 13/649,777, now U.S. Pat. No. 8,976,511 entitled PROTECTIVE ENCLOSURE FOR MODEL VEHICLE, filed Oct. 11, 2012, which is a continuation of U.S. patent application Ser. No. 11/872,872, filed Oct. 16, 2007, now U.S. Pat. No. 8,315,040 entitled PROTECTIVE ENCLOSURE FOR MODEL VEHICLE, issued Nov. 20, 2012.

BACKGROUND OF THE INVENTION

Field of the Invention

The present invention relates to protective enclosures and, more particularly, to protective enclosures having provision for transverse conveyances.

Description of the Related Art

Remotely controllable model cars are generally designed to operate on land, and are often designed to be maintainable and modifiable by untrained users. Thus, control modules and receiver electronics packages, electronic sensors and mechanical sensors, are typically susceptible to damage from contaminants such as water, mud, dirt and snow. A permanently sealed enclosure, which could protect a control module from contaminants while permitting a transverse conveyance, i.e. a wire or a tube passing from the inside to the outside, would complicate modification and repair by a typical user.

Assembly, modification and repair of a remotely controllable car may include the addition, removal and/or substitution of control modules, which may result in the use of a different number of wires and tubes entering a protective enclosure, as well as the use of wires and tubes of differing diameters. Consequently, there exists a need for a protective enclosure that protects a control module from contaminants while permitting transverse conveyances of differing sizes and varying numbers, and also retains its sealing properties, despite multiple episodes of opening and closing the enclosure.

SUMMARY OF THE INVENTION

The present invention provides protective enclosure that protects a control module from contaminants while permitting entry of transverse conveyances while retaining its sealing properties.

BRIEF DESCRIPTION OF THE DRAWINGS

For a more complete understanding of the present invention and the advantages thereof, reference is now made to the following Detailed Description taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, specific details, and the like have been omitted inasmuch as such details are not considered necessary to obtain a complete understanding of the present invention, and are considered to be within the understanding of persons of ordinary skill in the relevant art.

Figure 1:
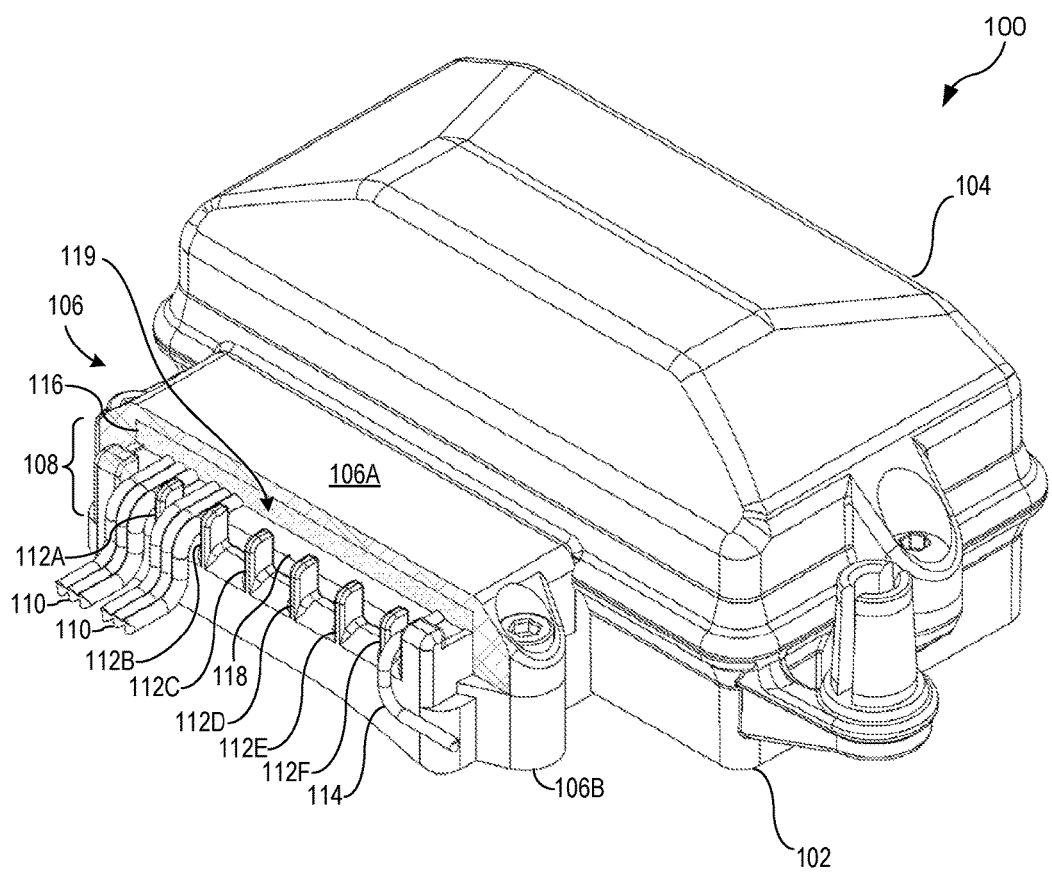
FIG. 1 illustrates a perspective view of an embodiment of a protective enclosure.

Turning now to FIG. 1, the reference numeral 100 generally indicates an embodiment of a protective enclosure. In the illustrated embodiment, protective enclosure 100 comprises a base 102, a cover 104 and a clamp 106. Clamp 106, which may provide strain relief to transverse conveyances, comprises a top portion 106a and a bottom portion 106b, and has a mouth 108, through which conveyances, such as ribbon cables 110 and a wire 114 may traverse the enclosure 100. It should be understood that enclosure 100 may comprise a single piece of material, in which, for example, clamp portions 106a and 106b are already connected to cover 104 and base 102, respectively, and cover 104 and base 102 are hinged. Alternatively, enclosure 100 may multiple pieces, in which, for example, base 102, cover 104, top clamp portion 106a and bottom clamp portion 106b comprise separate portions that are coupleable, i.e. configured to be assembled together. The embodiment illustrated in FIG. 1, however, shows bottom clamp portion 106b and base 102 as a single piece to which cover 104 and top clamp portion 106a are coupleable. It should be further understood that transverse conveyances may include tubes, such as vacuum hose, pressurized hose, or tubes encasing movable cables.

Enclosure 100, as illustrated, is configured to house a control device for a model vehicle, for example a remotely controllable model car, in an environment protected from contaminants, such as water, mud, dirt and snow. The control device may comprise an electronic module, such as a receiver, transmitter, sensor, switch or power supply, a mechanical module, such as a gear, lever or valve assembly, and/or an electromechanical module, such as a motor, generator, or mechanically operated electrical switch. Some embodiments of enclosure 100 may house multiple modules.

Figure 2:
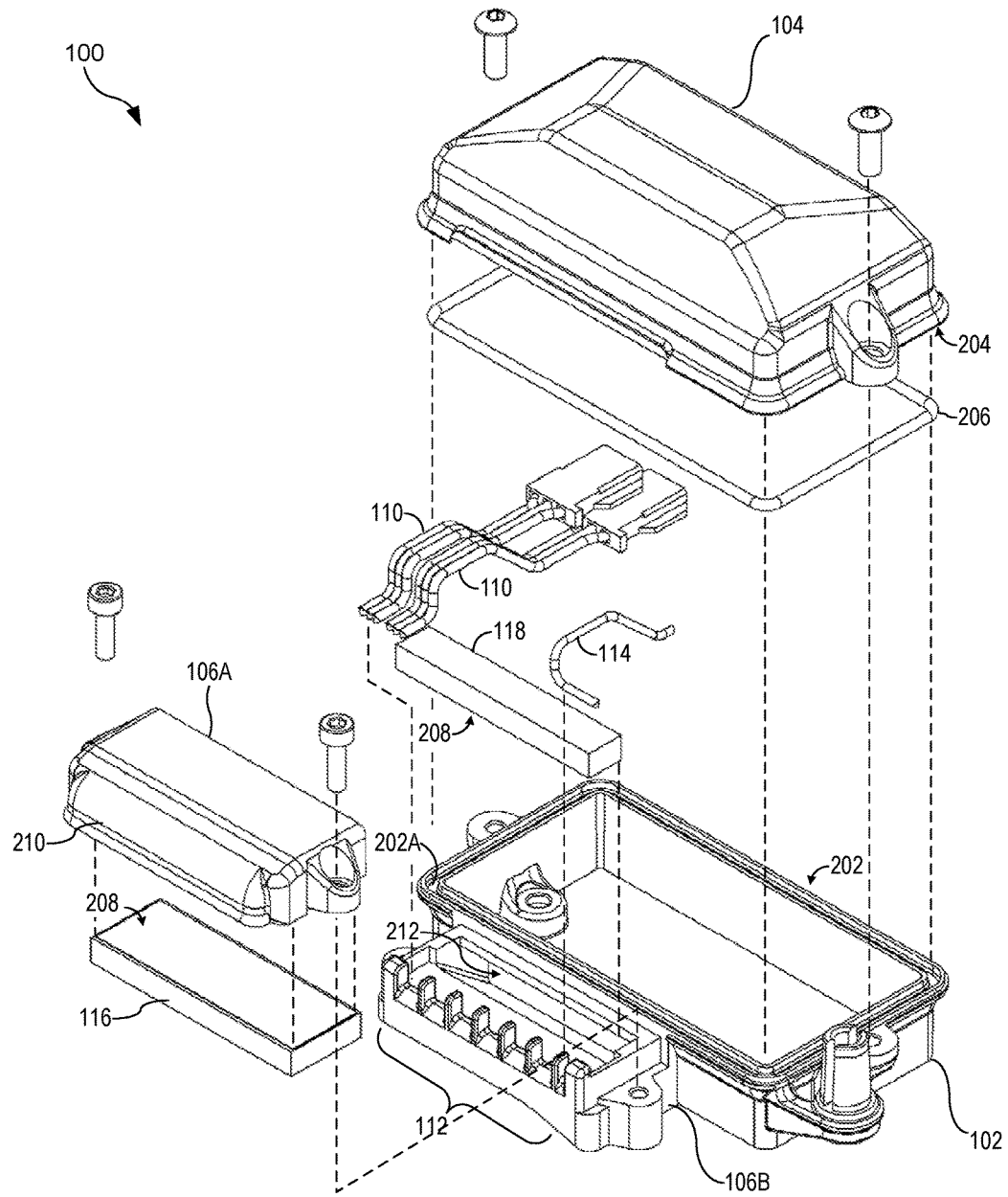
FIG. 2 illustrates an exploded assembly view of the protective enclosure of FIG. 1.
Figure 5:
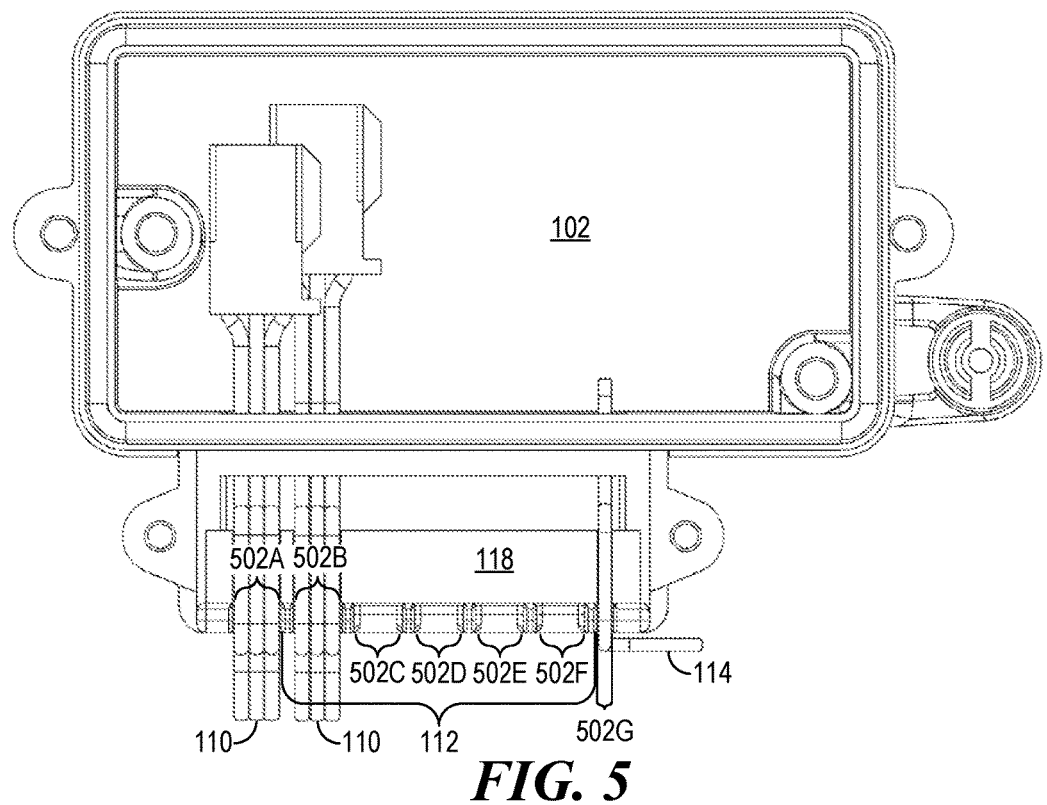
FIG. 5 illustrates a top interior view of the protective enclosure of FIG. 1.

FIG. 1 further illustrates conveyance alignment guides 112A-F adjacent to mouth 108 of clamp 106. In order to illustrate conveyance alignment guides 112A-F, enclosure 100 is illustrated with a splash shield 210 cut away. Splash shield 210 is illustrated in FIG. 2. The set of conveyance alignment guides 112, also shown in FIG. 2, forms a set of sub-apertures 502A-502G across mouth 108. Sub-apertures 502A-502G are indicated in FIG. 5 for improved clarity, and are illustrated as having non-identical widths. Conveyance alignment guides 112A-G align transverse conveyances, including ribbon cables 110 and wire 114, in clamp 106. In the illustrated embodiment, conveyance alignment guide 112A and 112B restrict motion of ribbon cables 110, and conveyance alignment guide 112F restricts motion of wire 114. In some embodiments, sub-apertures 502A-502G are sized such that the insulation or other external housings of transverse conveyances effectively blocks out contaminants, forming a seal. For example, if gaps between the outside of wire 114 and the interior of sub-aperture 402G are small enough, contaminants are unlikely to pass through the gaps and into the inside of enclosure 100. Thus, for some embodiments, the set of conveyance alignment guides 112 may form a sealing layer for clamp 106. Grommets and/or other flexible sealing material, such as room temperature vulcanizing (RTV) rubber, around transverse conveyances may provide further sealing.

In FIG. 1, clamp 106 is also illustrated as comprising flexible layers 116 and 118, which also form sealing layers. In some embodiments flexible layer 116 and/or flexible layer 118 comprise foam rubber, although other compressible materials may be used. When assembled with ribbon cables 110 and wire 114 in place, flexible layers 116 and 118 compress and conform to the shapes and sizes of the transverse conveyances. For example, flexible layers 116 and 118 form a seal 119 to prevent contaminants from entering enclosure 100, even when ribbon cables 110 and wire 114 pass through mouth 108 of clamp 106. It should be understood that flexible layers 116 and 118 are able to form the seal 119 even where ribbon cables 110 and wire 114 have differing diameters, or have been moved from one of sub-apertures 502A-502G to another. Thus, the illustrated embodiment of enclosure 100 comprises at least three sealing layers: the set of conveyance alignment guides 112, flexible layer 116 and flexible layer 118. However, it should be understood that some embodiments may comprise a greater or lesser quantity of sealing layers.

As illustrated, the set of conveyance alignment guides 112 is able to deflect contaminants from at least a portion of flexible layers 116 and 118, thereby forming a protective shield for flexible layers 116 and 118. In some embodiments, flexible layers 116 and 118 are constructed with materials that may degrade with age, exposure to contaminants, and repeated opening and closing of clamp 106. The protective nature of conveyance alignment guides 112A-G can extend the lifespan of flexible layers 116 and 118. Further, to ensure durability, some embodiments of enclosure 100 use replaceable flexible layers 116 and 118.

FIG. 2 illustrates an exploded assembly view of enclosure 100. In the illustrated embodiment, splash shield 210 is attached to top clamp portion 106A, although it should be understood that splash shield 210 may be a separate piece, coupleable to enclosure 100. Splash shield 210 obscures at least a portion of mouth 108 of clamp 106 to deflect contaminants away from mouth 108, further protecting flexible layers 116 and 118. An adhesive strip 208 is illustrated on flexible layer 116, which affixes flexible layer 116 to clamp top portion 106A. Another adhesive strip 208 on the underside of flexible layer 118 affixes flexible layer 118 to bottom clamp portion 106B. In the illustrated embodiment, when flexible layer 116 or 118 becomes worn, it may be replaced by pulling it out and affixing the replacement layer 116 or 118 in place using adhesive strip 208.

Base 102 comprises a conveyance aperture 212, which permits ribbon cables 110 and wire 114 to traverse enclosure 100, passing from the inside to the outside. Aperture 212 is configured to be offset from mouth 108 of clamp 106, illustrated as aperture 212 being vertically offset and below the expected location of mouth 108, when clamp 106 is assembled. It should be understood, however, that a different offset, such as a horizontal or diagonal offset, may be used. Ribbon cables 110 and wire 114 are illustrated as bent as they would be when enclosure 100 is assembled. It can be seen in FIG. 2 that the relative positions and orientations of aperture 212, clamp 106 and splash shield 210 force ribbon cables 110 and wire 114 through a curved path, having a total bend of greater than 90 degrees, although this total bend is comprised of multiple bends, each of which may be less than 90 degrees. This curved path further protects the inside of enclosure 100 from the likelihood of contamination through aperture 212. Aperture 212 is therefore sealed against contaminants by clamp 106.

The illustrated embodiment of enclosure 100 further comprises a gasket 206, illustrated as a compressible, replaceable ring, although other embodiments may comprise different removable and/or permanent gasket types. Gasket 206 is compressed between mating surfaces 202 and 204 on base 102 and cover 104, respectively. Mating surfaces 202 and 204 are illustrated as continuous, having no gaps or notches for transverse conveyances. Mating surfaces 202 and 204 are configured to form a seal in order to keep contaminants out of enclosure 100 when cover 104 and base 102 are coupled together. In the illustrated embodiment, mating surface 202 comprises a channel 202A, which is configured to retain gasket 206 in place during assembly.

Figure 3:
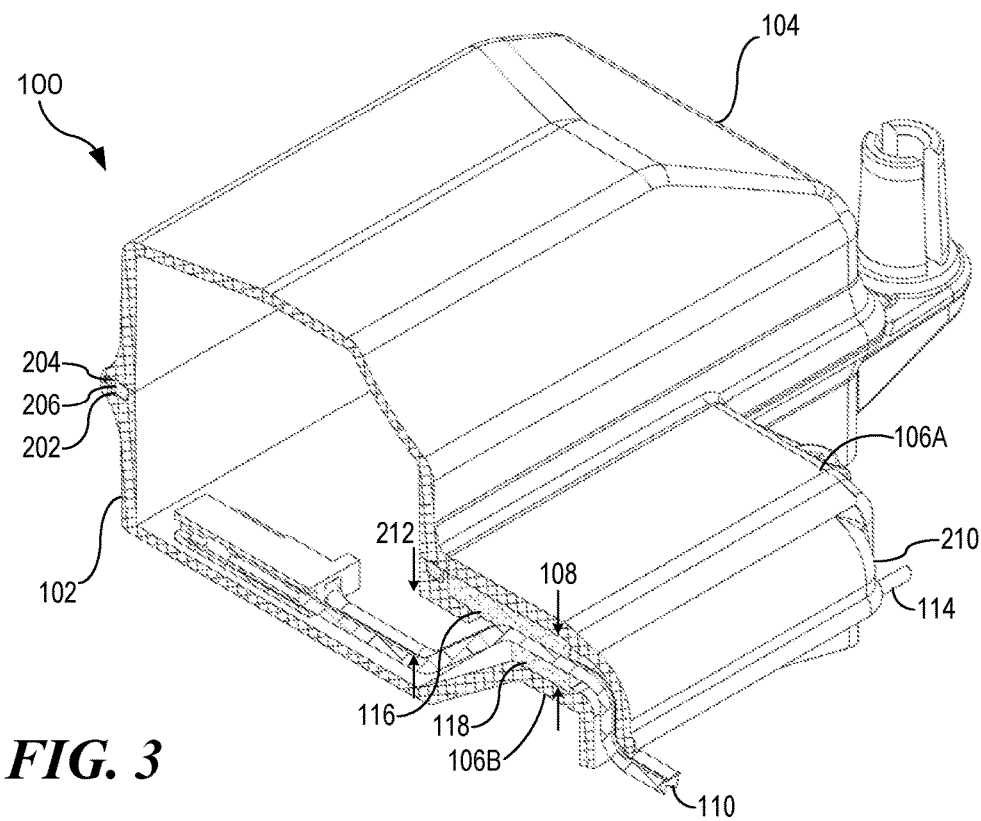
FIG. 3 illustrates a cutaway perspective view of the protective enclosure of FIG. 1.

FIG. 3 illustrates a cutaway perspective view of enclosure 100, as assembled. A ribbon cable 110 is illustrated traversing enclosure 100, bending more than 90 degrees as it passes through aperture 212, mouth 108 of clamp 106, which is offset from aperture 212, and beneath splash shield 210. Mating surfaces 202 and 204 are illustrated forming a seal that includes gasket 206.

Figure 4:
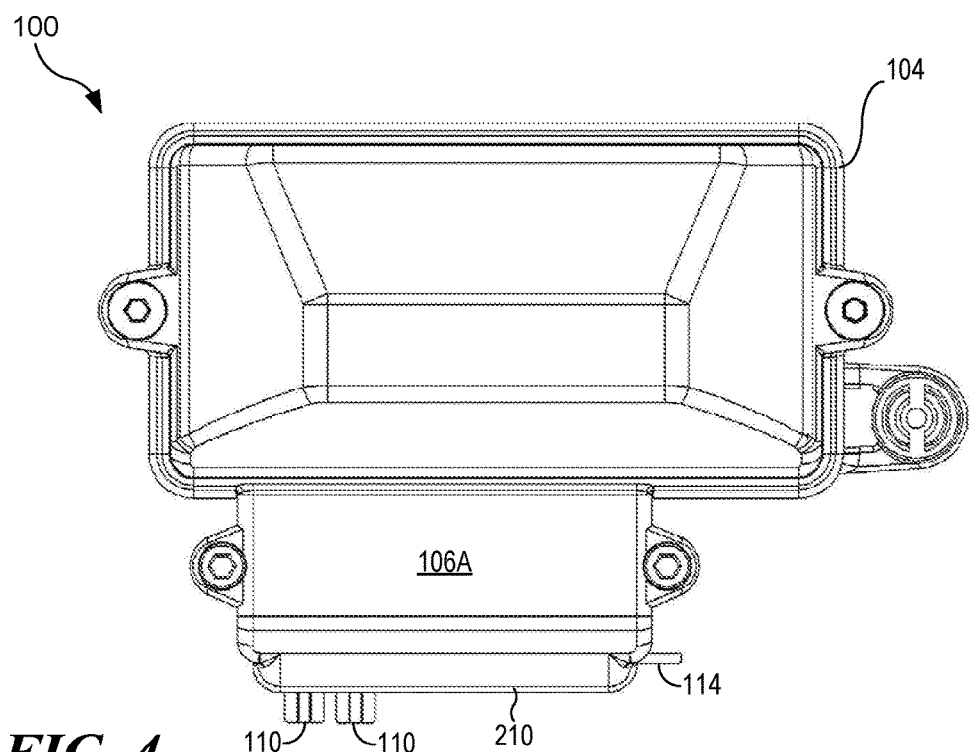
FIG. 4 illustrates a top view of the protective enclosure of FIG. 1.

FIG. 4 illustrates a top view of enclosure 100, as assembled, with ribbon cables 110 and wire 114 traversing enclosure 100. FIG. 5 illustrates a cutaway top view of enclosure 100, showing the interior of base 102, with cover 104 and top clamp portion 106A removed. Sub-apertures 502A-G, formed adjacent to mouth 108 of clamp 106 by the set of conveyance alignment guides 112, are identified. Ribbon cables 110 and wire 114 are illustrated passing above flexible layer 118.

Figure 6:
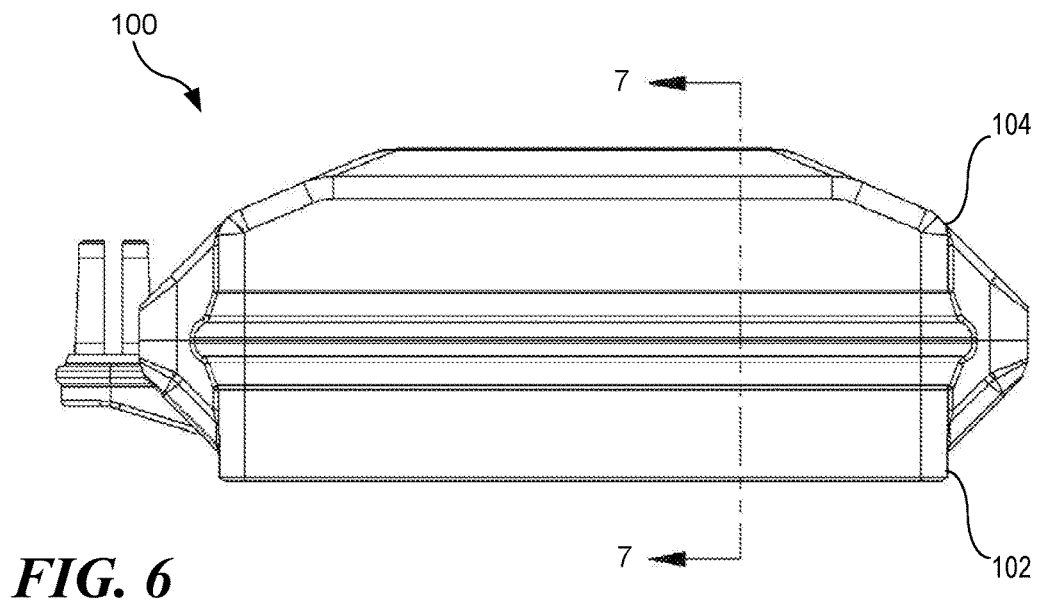
FIG. 6 illustrates a rear view of the protective enclosure of FIG. 1.
Figure 7:
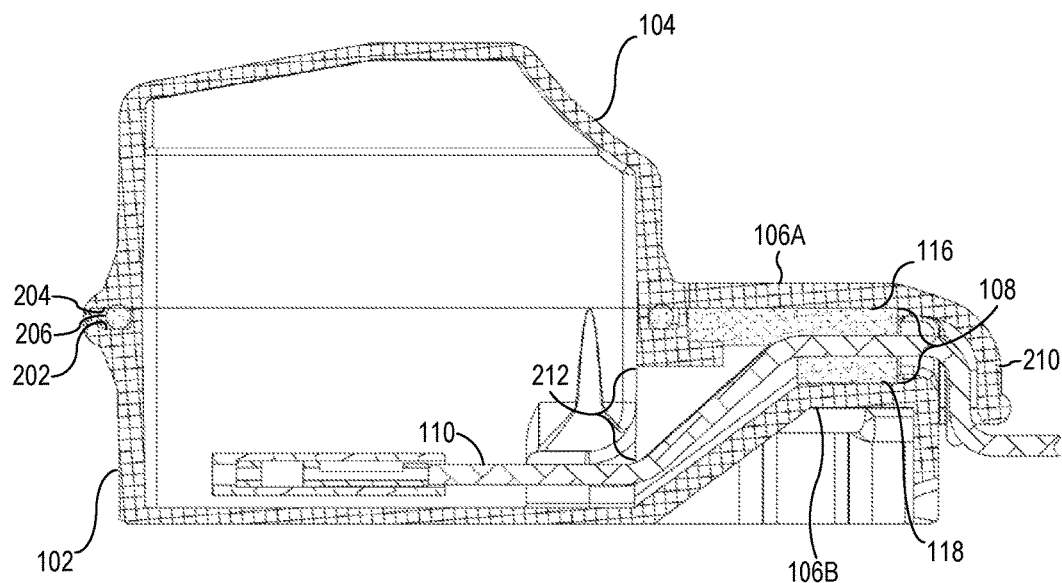
FIG. 7 illustrates a cutaway side view of the protective enclosure of FIG. 1.

FIG. 6 illustrates a rear view of enclosure 100, indicating plane 7 used for the cutaway side view of FIG. 7. In FIG. 7, enclosure 100 is illustrated as assembled, with ribbon cables 110 passing through aperture 212, disposed between flexible layers 116 and 118, and bending downward to pass out of mouth 108 and past splash shield 210.

Figure 8:
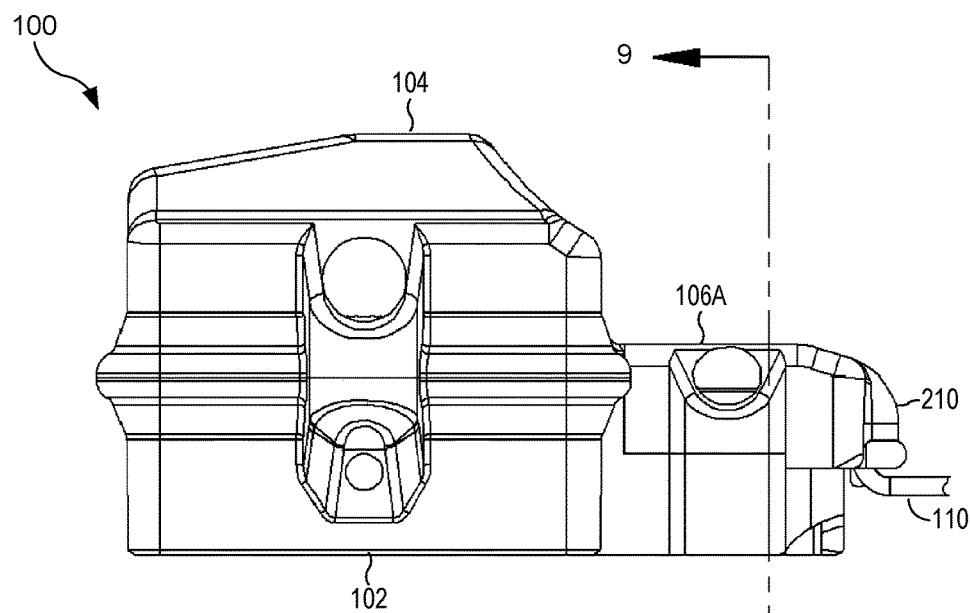
FIG. 8 illustrates a side view of the protective enclosure of FIG. 1.
Figure 9:
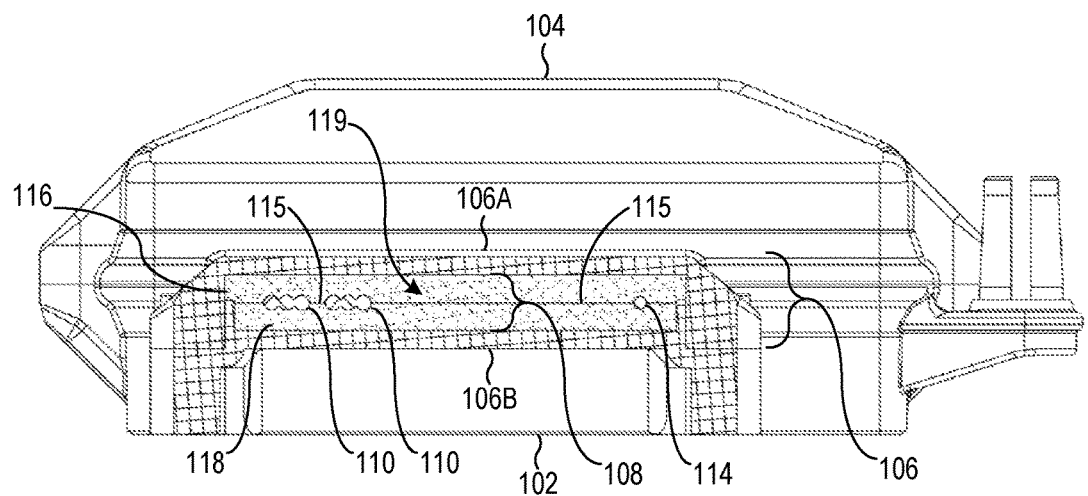
FIG. 9 illustrates a cutaway front view of the protective enclosure of FIG. 1.

FIG. 8 illustrates a side view of enclosure 100, indicating plane 9 used for the cutaway front view of FIG. 7. Plane 9 is between splash shield 210 and base 102. In FIG. 9, ribbon cables 110 and wire 114 are illustrated as passing between flexible layers 116 and 118. Flexible layers 116 and 118 of the seal 119 compress to conform to the shapes and sizes of ribbon cables 110 and wire 114, sealing gaps 115 in order to protect the interior of enclosure 100 from contaminants.

Figure 11:
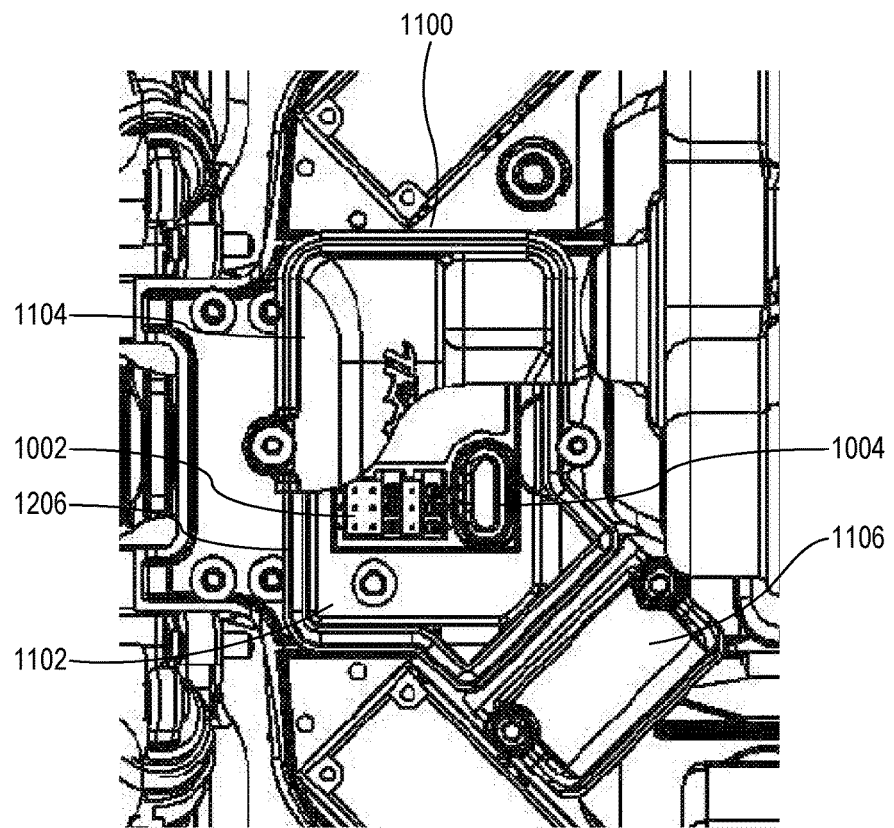
FIG. 11 illustrates a cutaway view of the protective enclosure of FIG. 10.
Figure 10:
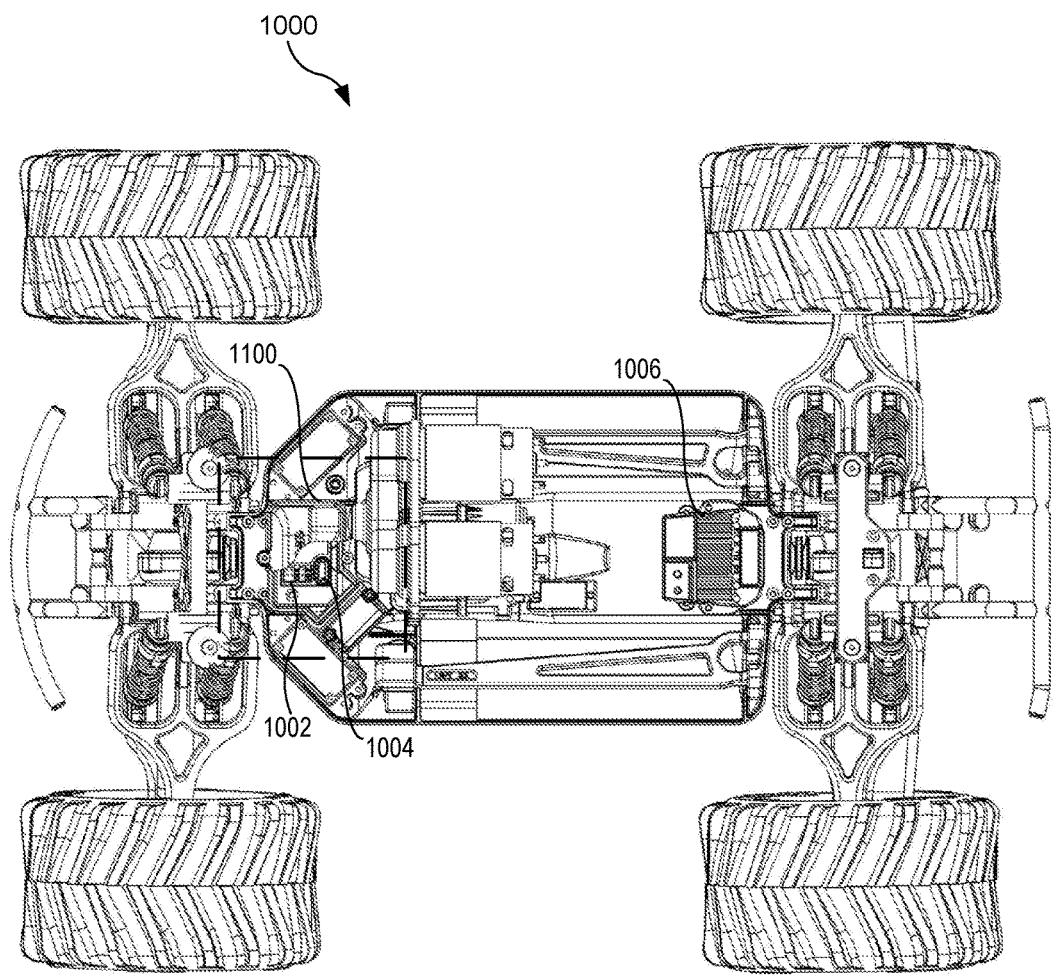
FIG. 10 illustrates an embodiment of a remotely controllable car comprising another embodiment of a protective enclosure.

FIG. 10 illustrates an embodiment of a remotely controllable car 1000 with another embodiment of a protective enclosure 1100. Remotely controllable car 1000 also comprises a drive train 1006, which is controlled by control devices 1002 and 1004 inside enclosure 1100. FIG. 11 illustrates a close-up cutaway view of enclosure 1100, which comprises a base 1102, a cover 1104, a gasket 1206 and a clamp 1106. It should be understood that remotely controllable car 1000 may comprise multiple protective enclosures 100 and/or 1100. It should be further understood that control devices 1002 and 1004 may be electronic, mechanical and/or electromechanical modules, and that a greater or lesser quantity may be used.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

The invention claimed is:

1. A protective enclosure for a model vehicle, comprising:
    a first enclosure portion comprising:
        a conveyance aperture;
        a first mating surface;
    a second enclosure portion comprising:
        a second mating surface;
    a clamp comprising:
        a first clamp portion;
        a second clamp portion;
        a clamp mouth formed by the first clamp portion and the second clamp portion and offset from conveyance aperture;
        a clamp seal;
    an enclosure seal;
    a conveyance;
    wherein the first mating surface, the enclosure seal, and the second mating surface create a first seal between the first enclosure portion and the second enclosure portion;
    wherein the clamp mouth engages with the clamp seal, and along with the conveyance, create a second seal obstructing the conveyance aperture; and
    wherein the first seal and the second seal protect an enclosure interior from contaminant intrusion.

2. The protective enclosure according to claim 1, wherein a conveyance comprises a wire, tube, or ribbon cable.

3. The protective enclosure according to claim 1, wherein the clamp seal comprises a first clamp seal and a second clamp seal.

4. The protective enclosure according to claim 1, wherein the first enclosure portion is hingedly coupled to the second enclosure portion.

5. The protective enclosure according to claim 1, wherein the protective enclosure further comprises a splash shield inhibiting contaminant contact to the clamp mouth.

6. The protective enclosure according to claim 1, wherein the conveyance comprises two or more conveyances, and wherein the protective enclosure further comprises a sub-aperture to separate the two or more conveyances.

7. The protective enclosure according to claim 1, wherein the first mating surface is continuous.

8. The protective enclosure according to claim 1, wherein the second mating surface is continuous.

9. The protective enclosure according to claim 1, wherein the first and the second mating surfaces are continuous.

10. A protective enclosure for a model vehicle, comprising:
    a first enclosure portion comprising:
        a conveyance aperture;
        a first mating surface;
    a second enclosure portion comprising:
        a second mating surface;
    a clamp operatively independent of one of at least the first enclosure or the second enclosure and comprising:
        a first clamp portion;
        a second clamp portion;
        a clamp mouth formed by the first clamp portion and the second clamp portion and offset from the conveyance aperture;
        a clamp seal;
    an enclosure seal;
    a conveyance;
    wherein the first mating surface, the enclosure seal, and the second mating surface create a first seal between the first enclosure portion and the second enclosure portion;
    wherein the clamp mouth engages the clamp seal, and along with the conveyance, create a second seal obstructing the conveyance aperture; and
    wherein the first seal and the second seal protect an enclosure interior from contaminant intrusion.

11. The protective enclosure according to claim 10, wherein the clamp mouth is obscured by a splash shield.

12. The protective enclosure according to claim 10, wherein the conveyance comprises two or more conveyances and a sub-aperture is located proximate to the clamp mouth and separates the two or more conveyances.

13. The protective enclosure according to claim 10, wherein the conveyance comprises a wire, a tube, or a ribbon cable.

14. The protective enclosure according to claim 13, wherein the tube contains a movable cable.

15. A protective enclosure for a model vehicle, comprising:
    a first enclosure portion comprising:
        a conveyance aperture;
        a first mating surface;
    a second enclosure portion comprising:
        a second mating surface;
    a clamp comprising:
        a first clamp portion;
        a second clamp portion;
        a clamp mouth formed by the first clamp portion and the second clamp portion and offset from the conveyance aperture;
        a clamp seal;
    an enclosure seal;
    two or more conveyances;
    sub-apertures separating the two or more conveyances;
    wherein the first mating surface, the enclosure seal, and the second mating surface create a first seal between the first enclosure portion and the second enclosure portion;
    wherein the clamp mouth engages the clamp seal, and along with the two or more conveyances, create a second seal obstructing the conveyance aperture; and
    wherein the first seal and the second seal protect an enclosure interior from contaminant intrusion.

16. The protective enclosures of claim 15, wherein the sub-apertures are located proximate to the clamp mouth, and outside of the first and second enclosure portions.

17. The protective enclosures of claim 15, wherein the sub-apertures are located proximate to the conveyance aperture, and inside of the first and second enclosure portions.

18. The protective enclosures of claim 15, wherein the conveyance comprises a wire, a tube, or a ribbon cable.

19. The protective enclosures of claim 15, wherein the first enclosure portion is hingedly coupled to the second enclosure portion.

20. The protective enclosures of claim 15, further comprising a splash shield to protect the clamp mouth from contaminants.

\* \* \* \* \*